(12) United States Patent
Miyata (10) Patent No.: US 12,040,587 B2
(45) Date of Patent: Jul. 16, 2024

(54) OPTICAL SEMICONDUCTOR DEVICE

(71) Applicant: SUMITOMO ELECTRIC DEVICE INNOVATIONS, INC., Yokohama (JP)

(72) Inventor: Mitsuyoshi Miyata, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 807 days.

(21) Appl. No.: 17/265,283

(22) PCT Filed: Dec. 17, 2019

(86) PCT No.: PCT/JP2019/049361
§ 371 (c)(1),
(2) Date: Feb. 2, 2021

(87) PCT Pub. No.: WO2020/137682
PCT Pub. Date: Jul. 2, 2020

(65) Prior Publication Data
US 2021/0305766 A1 Sep. 30, 2021

(30) Foreign Application Priority Data
Dec. 26, 2018 (JP) .................................. 2018-243706

(51) Int. Cl.
*H01S 3/04* (2006.01)
*H01S 5/02208* (2021.01)
(Continued)

(52) U.S. Cl.
CPC ...... *H01S 5/02208* (2013.01); *H01S 5/02218* (2021.01); *H01S 5/023* (2021.01);
(Continued)

(58) Field of Classification Search
CPC .. H01S 5/02208; H01S 5/02218; H01S 5/023; H01S 5/02345; H01S 5/0239;
(Continued)

(56) References Cited

U.S. PATENT DOCUMENTS

| 2004/0089865 A1* | 5/2004 | Arthur | ................ H01L 31/0203 |
| | | | 257/E31.118 |
| 2007/0102830 A1 | 5/2007 | Muto et al. | |

(Continued)

FOREIGN PATENT DOCUMENTS

| JP | 2001-244545 A | 9/2001 |
| JP | 2007-123741 A | 5/2007 |

(Continued)

*Primary Examiner* — Kinam Park
(74) *Attorney, Agent, or Firm* — Oliff PLC (57) ABSTRACT

An optical semiconductor device includes a chassis that has an external wall, a feedthrough that penetrates the external wall of the chassis and has a projection portion projecting toward outside of the chassis from the external wall, a connection terminal that is electrically connected to a component mounted in the chassis and is on the projection portion of the feedthrough, a first temperature detector that is on an external face of the external wall of the chassis and detects a temperature of the chassis, and a flexible substrate of which an end is connected to the connection terminal and of which a portion spaced from the end is connected to the first temperature detector, wherein the first temperature detector is between the external wall and the flexible substrate.

5 Claims, 8 Drawing Sheets

(51) Int. Cl.
*H01S 5/02218* (2021.01)
*H01S 5/023* (2021.01)
*H01S 5/02345* (2021.01)
*H01S 5/0239* (2021.01)
*H01S 5/024* (2006.01)
*H01S 5/06* (2006.01)
*H01S 5/0687* (2006.01)
*H01S 5/00* (2006.01)

(52) U.S. Cl.
CPC ........ *H01S 5/02345* (2021.01); *H01S 5/0239* (2021.01); *H01S 5/02415* (2013.01); *H01S 5/0612* (2013.01); *H01S 5/0687* (2013.01); *H01S 5/0014* (2013.01)

(58) Field of Classification Search
CPC .. H01S 5/02415; H01S 5/0612; H01S 5/0687; H01S 5/0014
See application file for complete search history.

(56) References Cited

U.S. PATENT DOCUMENTS

| | | | |
|---|---|---|---|
| 2015/0156885 A1* | 6/2015 | Ono | H05K 3/3494 |
| | | | 228/256 |
| 2015/0282357 A1* | 10/2015 | Osawa | H01L 23/047 |
| | | | 174/535 |
| 2017/0310078 A1* | 10/2017 | Hirayama | H01S 5/02345 |
| 2018/0337319 A1* | 11/2018 | Migita | H10N 10/17 |
| 2019/0052049 A1* | 2/2019 | Sato | H01S 5/4012 |
| 2020/0303897 A1* | 9/2020 | Misawa | H01S 5/02345 |

FOREIGN PATENT DOCUMENTS

| | | |
|---|---|---|
| JP | 2009-260095 A | 11/2009 |
| JP | 2011-238857 A | 11/2011 |
| JP | 2015-211078 A | 11/2015 |

* cited by examiner

OPTICAL SEMICONDUCTOR DEVICE

TECHNICAL FIELD

The present invention relates to an optical semiconductor device. This application is based upon and claims the benefit of priority of the prior Japanese Patent Application No. 2018-243706, filed on Dec. 26, 2018, the entire contents of which are incorporated herein by reference.

BACKGROUND ART

There is developed an optical semiconductor device which houses a semiconductor laser element or the like in a chassis thereof and has terminals for inputting or outputting an electrical signal on the chassis (for example, see Patent Document 1). There is a case where a flexible substrate is used for connection with an external component (for example, see Patent Document 2).

PRIOR ART DOCUMENT

Patent Document

Patent Docuemnt 1: Japanese Patent Application Publication No. 2001-244545
Patent Document 2: Japanese Patent Application Publication No. 2007-123741

SUMMARY OF THE INVENTION

An optical semiconductor device of the present invention includes: a chassis that has an external wall; a feedthrough that penetrates the external wall of the chassis and has a projection portion projecting toward outside of the chassis from the external wall; a connection terminal that is electrically connected to a component mounted in the chassis and is provided on the projection portion of the feedthrough; a first temperature detector that is provided on an external face of the external wall of the chassis and detects a temperature of the chassis; and a flexible substrate of which an end is connected to the connection terminal and of which a portion spaced from the end is connected to the first temperature detector, wherein the first temperature detector is provided between the external wall and the flexible substrate.

PROBLEMS TO BE SOLVED BY THE PRESENT DISCLOSURE

The number of the information types such as inputting of an electrical signal into the semiconductor laser element, detection of a temperature, control of the temperature between inside of a chassis of a semiconductor laser element and outside of the chassis increases. It may be difficult to detect the temperature, when the number of the terminals is smaller than the number of the information types, for example, when terminals for a thermistor are not secured. The number of the terminals may be increased according to the information types. However, it is difficult to newly provide terminals, because the device is downsized. And so, the object of the present invention is to provide an optical semiconductor device capable of detecting a temperature in which the number of terminals is reduced.

Effects of the Present Disclosure

According to the present disclosure, it is possible to suppress increasing of the number of the terminals and detect a temperature.

MODES FOR CARRYING OUT THE INVENTION

Description of Embodiments of the Present Invention

First, details of embodiments of the present disclosure will be described as listed below.

An embodiment of the present disclosure is (1) an optical semiconductor device including: a chassis that has an external wall; a feedthrough that penetrates the external wall of the chassis and has a projection portion projecting toward outside of the chassis from the external wall; a connection terminal that is electrically connected to a component mounted in the chassis and is provided on the projection portion of the feedthrough; a first temperature detector that is provided on an external face of the external wall of the chassis and detects a temperature of the chassis; and a flexible substrate of which an end is connected to the connection terminal and of which a portion spaced from the end is connected to the first temperature detector, wherein the first temperature detector is provided between the external wall and the flexible substrate. The first temperature detector is not connected to external connection terminals. It is therefore possible to suppress increasing of the number of the external connection terminals. And it is possible to detect a temperature because the first temperature detector is provided on an external wall of the chassis.

(2) The first temperature detector may be bonded to the external wall via a heat dissipation resin. With the structure, it is possible to accurately detect a temperature with use of the first temperature detector.

(3) A thickness of the first temperature detector may be equal to a projection amount of the projection portion. When the thermistor is provided in a space around the projection portion, the space can be effectively used. And the optical semiconductor device can be downsized.

(4) A wavelength tunable laser element that is housed in the chassis may be further provided. A second temperature detector that detects a temperature of the wavelength tunable laser element may be further provided. The connection terminal may input an electrical signal into the wavelength tunable laser element via a first wiring that is provided on the wavelength tunable laser element, the second temperature detector and the flexible substrate. It is possible to adjust the temperature in the chassis with use of the temperature adjusting element. And it is possible to suppress the increasing of the number of the connection terminals.

(5) A second wiring that is provided on the flexible substrate and has a pad connected to an electrode of the first temperature detector may be further provided on a face that is different from a face on which the first wiring is provided. It is possible to connect the flexible substrate to the connection terminals and the first temperature detector.

Details of Embodiments of the Present Invention

The following describes specific examples of an optical semiconductor element and a method of manufacturing the same and an optical integrated semiconductor element and a method of manufacturing the same in accordance with embodiments of the present disclosure with reference to drawings. It should be noted that the present disclosure is not limited to these examples but is shown by the claims, and it is intended that all modifications are included in the equivalents of the claims and the scope of the claims.

First Embodiment

Figure 1A:
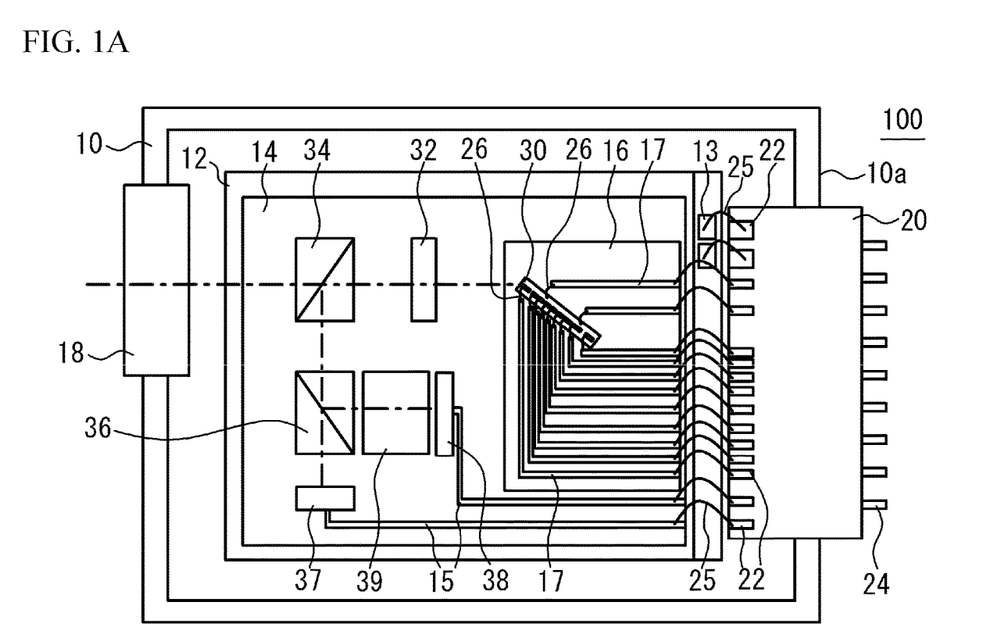
FIG. 1A illustrates a plan view of an optical semiconductor device in accordance with a first embodiment.
Figure 1B:
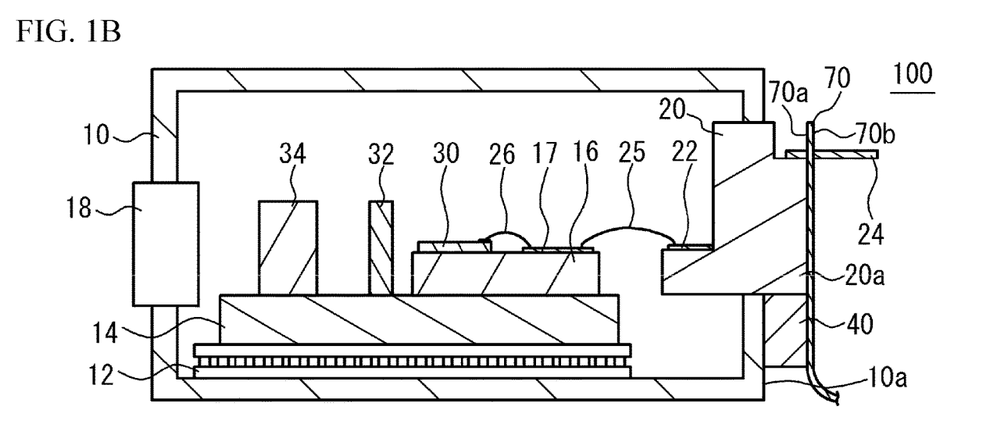
FIG. 1B illustrates a cross sectional view of an optical semiconductor device.

FIG. 1A illustrates a plan view of an optical semiconductor device 100 in accordance with a first embodiment. FIG. 1B illustrates a cross sectional view of the optical semiconductor device 100. A dashed line of FIG. 1A indicates a path of an output light of a wavelength tunable laser element 30. In FIG. 1A, a thermistor 40 and a flexible substrate 70 are not illustrated. FIG. 1A and FIG. 1B are schematic views. Wiring patterns and the number of the lead pins 24 may be changed.

As illustrated in FIG. 1A and FIG. 1B, the optical semiconductor device 100 is a TOSA (Transmitter Optical Sub Assembly) including a chassis 10, a feedthrough 20, the wavelength tunable laser element 30, the thermistor 40 (first temperature detector), and the flexible substrate 70. The chassis 10 is a parallelepiped shape in which a longitudinal size is 13 mm, a lateral size is 7 mm and a height size is 4 mm. Side walls of the chassis 10 are made of iron-nickel-cobalt alloy, for example. A bottom board of the chassis 10 is made of copper-tungsten alloy, for example. One of the side walls of the chassis 10 has a window 18. A lens is provided in the window 18. A light is output through the window 18 toward outside. Another side wall of the chassis 10 has the feedthrough 20 for inputting and outputting an electrical signal and has the thermistor 40.

The feedthrough 20 is made of ceramic such as aluminum oxide ($Al_2O_3$) or the like, and extends from inside of the chassis 10 to outside of the chassis 10. The thermistor 40 is attached to an external wall 10a of the chassis 10 through an adhesive agent, under the feedthrough 20. The adhesive agent is such as resin-based heat dissipation adhesive agent having high thermal conductivity (for example, epoxy-based resin or silicone-based resin). A thermal conductivity of the heat dissipation adhesive agent is, for example, 10 W/m·K. It is therefore possible to accurately detect a temperature of the chassis 10. A surface of the feedthrough 20 and a surface of the thermistor 40 are located in an identical plane.

The chassis 10 houses a temperature adjusting element 12, a carrier 14, a chip carrier 16, the wavelength tunable laser element 30, a lens 32, beam splitters 34 and 36, and light receiving elements 37 and 38. These components are sealed in the chassis 10.

The temperature adjusting element 12 includes a peltier element and acts as a TEC (Thermoelectric cooler). The carrier 14 and the chip carrier are made of ceramic such as $Al_2O_3$ or the like. The carrier 14 is mounted on the temperature adjusting element 12. The chip carrier 16, the lens 32, the beam splitters 34 and 36, the light receiving elements 37 and 38 and an etalon 39 are mounted on the carrier 14. The wavelength tunable laser element 30 is mounted on the chip carrier 16.

As described later, the wavelength tunable laser element 30 is a semiconductor element and emits a light. Each of the beam splitters 34 and 36 divides an input light into two lights. The light receiving elements 37 and 38 are photo diodes or the like, and output a current when receiving a light.

As illustrated in FIG. 1A, two wiring patterns 15 are provided on an upper face of the carrier 14. A plurality of wiring patterns 17 are provided on an upper face of the chip carrier 16. Two electrodes 13 are provided on an upper face of the temperature adjusting element 12.

The feedthrough 20 is made of ceramic including aluminum oxide, and has a projection portion 20a which projects to outside of the chassis 10. A plurality of wiring patterns 22 are provided on a surface of the feedthrough 20, in of the chassis 10. The projection portion 20a which is positioned out of the chassis 10 has a plurality of lead pins 24 projecting to outside of the chassis 10. Each of the lead pins 24 is electrically connected to each of the wiring patterns 22 through a wiring in the chassis 10. The plurality of lead pins 24 include lead pins connected to the wavelength tunable laser element 30, lead pins connected to the temperature adjusting element 12, and lead pint connected to the light receiving elements 37 and 38.

One of the two wiring patterns 15 of the carrier 14 is electrically connected to the light receiving element 37 and is connected to one of the wiring patterns 22 of the feedthrough 20 via a bonding wire 25. The other of the two wiring patterns 15 is electrically connected to the light receiving element 38 and is connected to another of the wiring patterns 22 via another bonding wire 25.

The wavelength tunable laser element 30 is electrically connected to the wiring patterns 17 of the chip carrier 16 via bonding wires 26. The wiring pattern 17 is also connected to the wiring pattern 22 via the bonding wire 25. The electrodes 13 of the temperature adjusting element 12 are electrically connected to the wiring patterns 22 of the feedthrough 20 via other bonding wires 25. As described above, the wiring patterns 22 are electrically connected to the lead pins 24.

As illustrated in FIG. 1B, the flexible substrate 70 faces with the external wall 10a of the chassis 10 and is connected to the lead pins 24 and the thermistor 40. The optical semiconductor device 100 is electrically connected to an external component such as a control device, via the flexible substrate 70. The flexible substrate 70 is a printed circuit substrate which is made of an insulating material and is bendable. A face 70a of the flexible substrate 70 faces with the optical semiconductor device 100. A face 70b of the flexible substrate 70 is opposite to the face 70a.

The thermistor 40 is provided between the flexible substrate 70 and the external wall 10a of the chassis 10. A thickness of the thermistor 40 is equal to a distance between the flexible substrate 70 and the external wall 10a of the chassis 10 and is also equal to a projection amount of the projection portion 20a of the feedthrough 20. When the thermistor 40 is located in a space under the projection portion 20a, the space can be effectively used. Therefore, the optical semiconductor device 100 can be downsized. The projection amount of the projection portion 20a and the thickness of the thermistor 40 are, for example, 0.5 mm. From a view point of allowable errors of the projection amount of the projection portion 20a and the thickness of the thermistor 40, in case where the thickness of the thermistor 40 is smaller than the projection amount of the projection portion 20a of the feedthrough 20 and a gap is formed between the thermistor 40 and the external wall 10a of the chassis 10, the thermistor 40 can be thermally connected to the external wall 10a of the chassis 10, when a heat dissipation spacer is provided between the thermistor 40 and the external wall 10a of the chassis 10 and heat dissipation adhesive agent is used. When heat dissipation spacers having a different thickness are prepared, the influence of heat releasing caused by the allowable errors can be suppressed.

Figure 2:
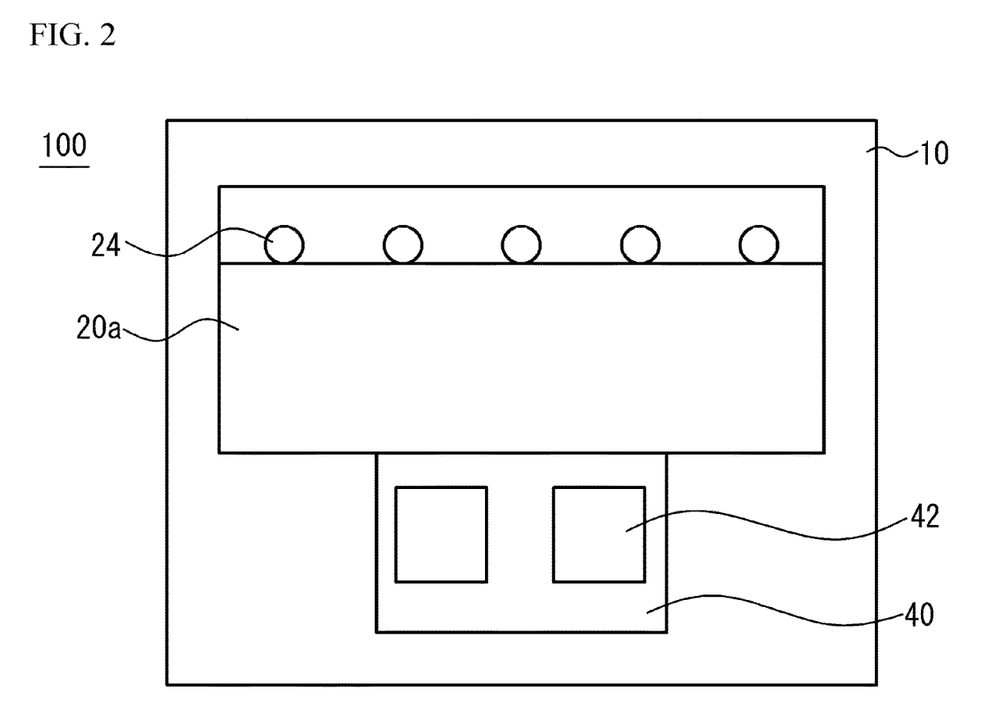
FIG. 2 illustrates a front view of an optical semiconductor device.

FIG. 2 illustrates a front view of the optical semiconductor device 100. In FIG. 2, vicinity of the feedthrough 20 and the thermistor 40 is enlarged. As illustrated in FIG. 2, the thermistor 40 has two electrodes 42 on a surface thereof. A longitudinal length of the thermistor 40 is 0.8 mm. A lateral length of the thermistor 40 is 1.6 mm. A longitudinal length and a lateral length of the electrodes 42 are 0.6 mm. The lead pins 24 and the electrodes 42 are located on the side of the external wall 10a of the optical semiconductor device 100.

Figure 3A:
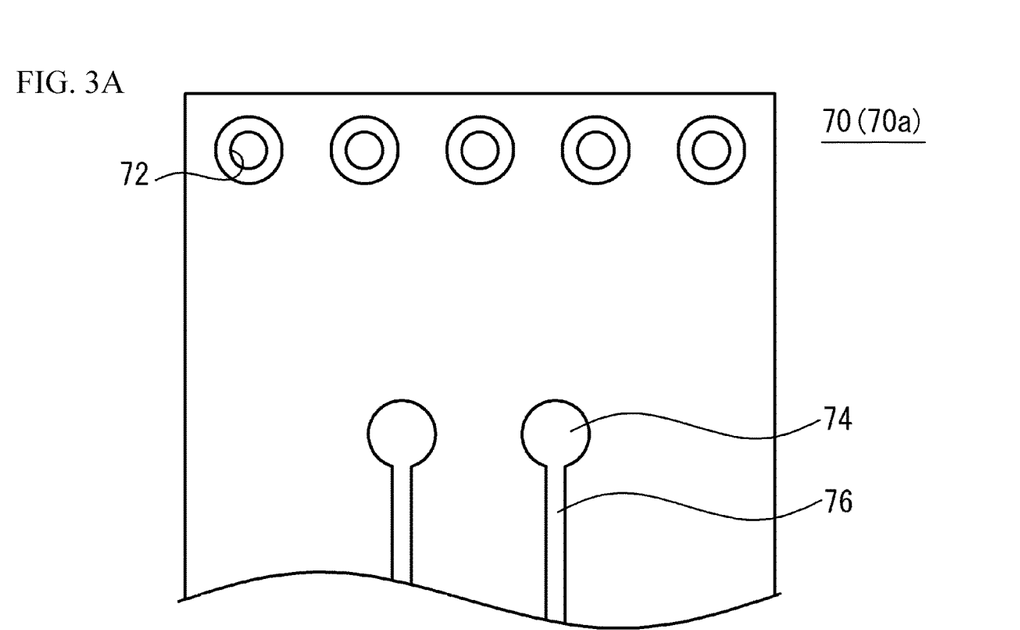
FIG. 3A illustrates front views of a flexible substrate.
Figure 3B:
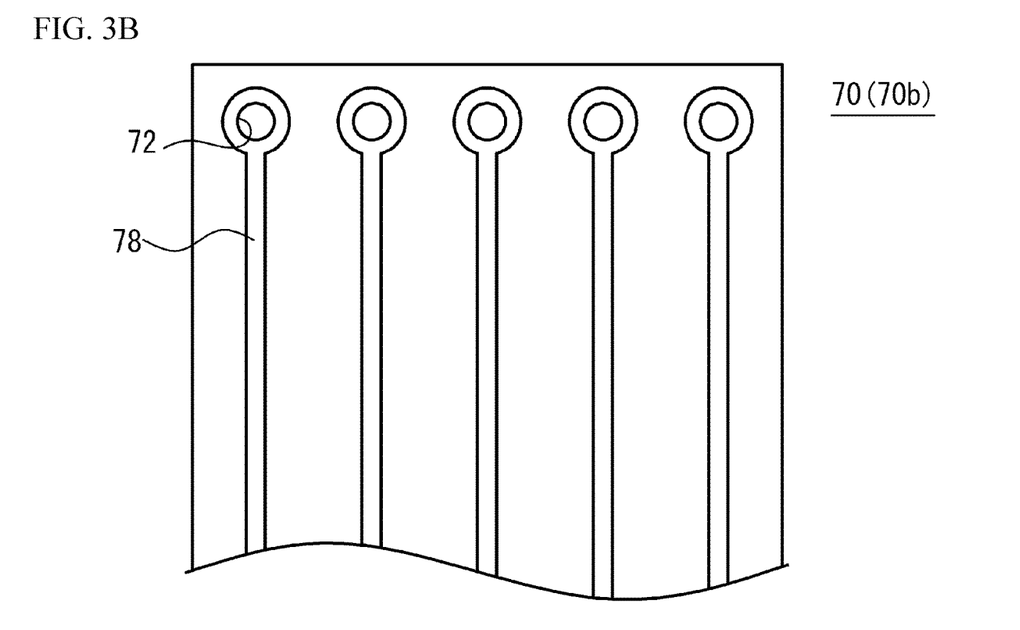
FIG. 3B illustrates front views of a flexible substrate.

FIG. 3A and FIG. 3B illustrate front views of the flexible substrate 70. FIG. 3A illustrates the face 70a. FIG. 3B illustrates the face 70b. As illustrated in FIG. 3A, two pads 74 and two wirings 76 (second wiring) are provided on the face 70a. Each of the wirings 76 is connected to each of the pads 74. The wirings 76 extend together with the flexible substrate 70. As illustrated in FIG. 3B, a plurality of wirings 78 (first wiring) are provided on the face 70b. A plurality of via electrodes 72 extend from the face 7a to the face 70b and penetrates the flexible substrate 70. Each of the wirings extends from each of the via electrodes 72. The wirings 76 and the wirings 78 are connected to one or more external components which are not illustrated.

Figure 4A:
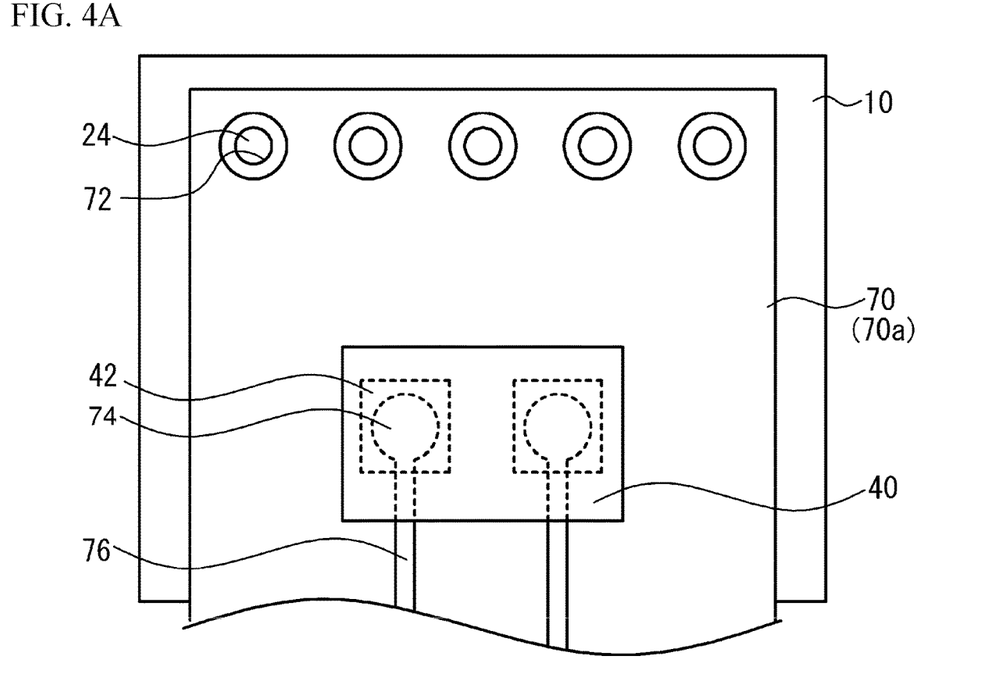
FIG. 4A illustrates front views of a case where a flexible substrate us connected to lead pins.
Figure 4B:
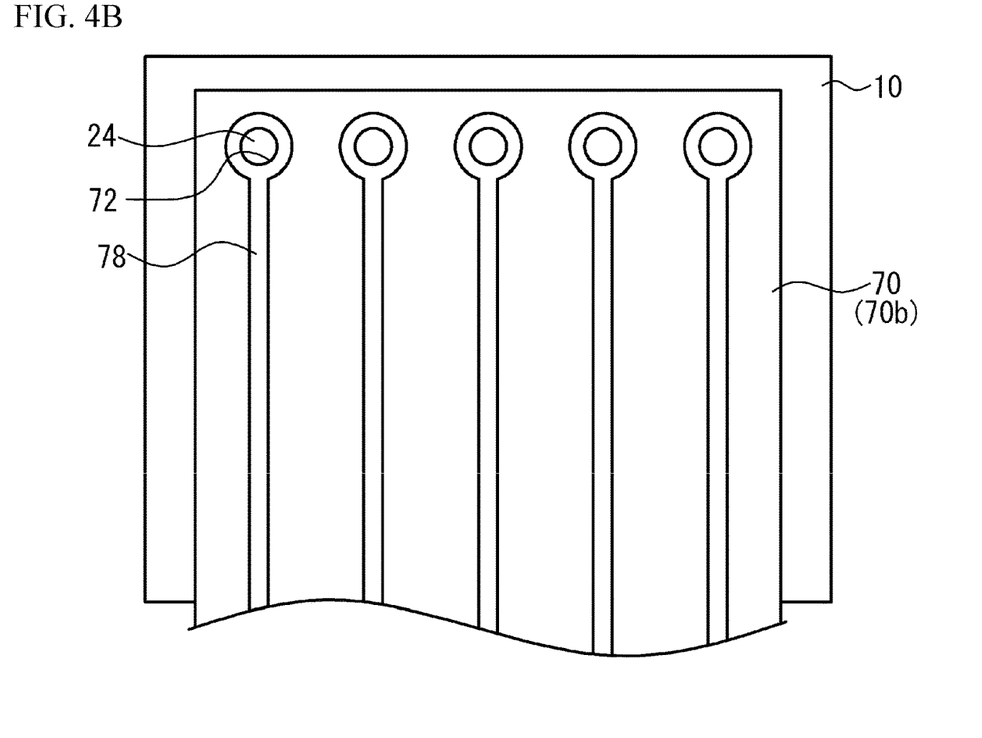
FIG. 4B illustrates front views of a case where a flexible substrate us connected to lead pins.

FIG. 4A and FIG. 4B illustrates front views of a case where the flexible substrate 70 is connected to the lead pins 24. FIG. 4A illustrates the side of the face 70a. FIG. 4B illustrates the side of the face 70b.

As illustrated in FIG. 4A, each of the lead pins 24 is inserted in each of the via electrodes 72 of the flexible substrate 70. Thus, the lead pins 24 are electrically connected to the wirings 78 of FIG. 4B. Each of the electrodes 42 of the thermistor 40 is connected to each of the pads 74 through solder.

Figure 5:
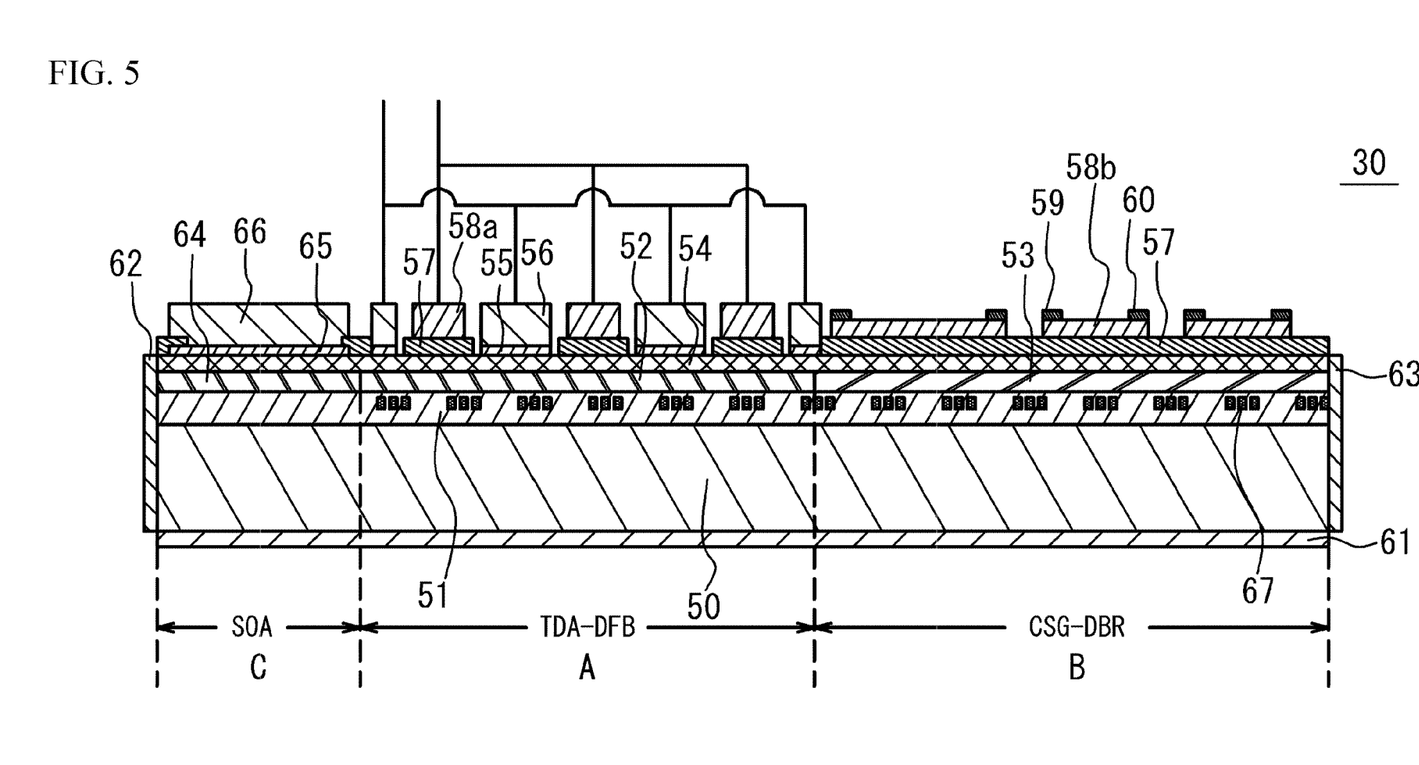
FIG. 5 illustrates a cross sectional view of a wavelength tunable laser element.

FIG. 5 illustrates a schematic cross sectional view of the wavelength tunable laser element 30. As illustrated in FIG. 5, the wavelength tunable laser element 30 has a TDA-DFB (Tunable Distributed Amplified-DFB) region A, a CSG-DBR (Chirped Sampled Grating Distributed Bragg Reflector) region B, and an SOA (Semiconductor Optical Amplifier) region C. The SOA region C, the TDA-DFB region A and the CSG-DBR region B are arrayed in this order from a front side to a rear side.

The TDA-DFB region A has a structure in which a lower cladding layer 51, an active layer 52, and an upper cladding layer 54 are laminated on a substrate 50. On the upper cladding layer 54, there are two or more sets of a region in which a contact layer 55 and an electrode 56 are laminated and a region in which a heater 58a is laminated on an insulating film 57.

The CSG-DBR region B has a structure in which the lower cladding layer 51, an optical waveguide layer 53, the upper cladding layer 54, the insulating film 57 and heaters 58b are laminated on the substrate 50. Each of the heaters 58b has a power supply electrode 59 and a ground electrode 60. The SOA region C has a structure in which the lower cladding layer 51, an optical amplification layer 64, the upper cladding layer 54, a contact layer 65 and an electrode 66 are laminated on the substrate 50.

The substrate 50, the lower cladding layer 51 and the upper cladding layer 54 are integrally formed in the TDA-DFB region A, the CSG-DBR region B and the SOA region C. The active layer 52, the optical waveguide layer 53, and the optical amplification layer 64 are formed on the same plane. An interface between the TDA-DFB region and the CSG-DBR region B corresponds to an interface between the active layer 52 and the optical waveguide layer 53.

A facet film 62 is formed on an facet of the substrate 50, the lower cladding layer 51, the optical waveguide layer 53 and the upper cladding layer 54 on the side of the SOA region C. In the embodiment, the facet film 62 is an AR (Anti Reflection) film. The facet film 62 acts as a front facet of the wavelength tunable laser element 30. A facet film 63 is formed on a facet of the substrate 50, the lower cladding layer 51, the optical waveguide layer 53, and the upper cladding layer 54 on the side of the CSG-DBR region B. In the embodiment, the facet film 63 is an AR film. The facet film 63 acts as a rear facet of the wavelength tunable laser element 30.

The substrate 50 is, for example, a crystal substrate made of n-type InP. The lower cladding layer 51 has n-type conductivity. The upper cladding layer 54 has p-type conductivity. The lower cladding layer 51 and the upper cladding layer 54 are, for example, made of InP. The lower cladding layer 51 and the upper cladding layer 54 confine a light in the active layer 52, the optical waveguide layer 53 and the optical amplification layer 64.

A plurality of diffraction gratings (corrugations) 67 are formed in the lower cladding layer 51 of the TDA-DFB region A and the CSG-DBR region B in a given interval. Thus, the TDA-DFB region A and the CSG-DBR region B have sampled gratings. The diffraction grating 67 is made of a material having a refractive index that is different from that of the lower cladding layer 51. The material of the diffraction grating is, for example, made of $Ga_{0.22}In_{0.78}As_{0.47}P_{0.53}$ when the lower cladding layer 51 is made of InP.

The active layer 52 is made of semiconductor having a gain. The active layer 52 may have a quantum well structure in which a well layer made of $Ga_{0.32}In_{0.68}As_{0.92}P_{0.08}$ having a thickness of 5 nm and a barrier layer made of $Ga_{0.22}In_{0.78}As_{0.47}P_{0.53}$ having a thickness of 10 nm are laminated alternately. The optical waveguide layer 53 is, for example, made of bulk semiconductor layer, and may be made of $Ga_{0.22}In_{0.78}As_{0.47}P_{0.53}$. In the embodiment, an energy gap of the optical waveguide layer 53 is larger than that of the active layer 52.

The optical amplification layer 64 achieves a gain when a current is supplied from the electrode 66, and amplifies a light. The optical amplification layer 64 may have a quantum well structure in which a well layer made of $Ga_{0.35}In_{0.65}As_{0.99}P_{0.01}$ having a thickness of 5 nm and a barrier layer made of $Ga_{0.15}In_{0.85}As_{0.32}P_{0.68}$ having a thickness of 10 nm are laminated alternately. As another structure, the optical amplification layer 64 may be made of a bulk semiconductor, and may be made of $Ga_{0.44}In_{0.56}As_{0.95}P_{0.05}$. The optical amplification layer 64 may be made of the same material as the active layer 52.

The contact layers 55 and 65 are, for example, made of p-type $Ga_{0.47}In_{0.53}As$ crystal. The insulating film 57 is a protective layer made of an insulator such as silicon nitride (SiN) or silicon oxide ($SiO_2$). The heaters 58a and 58b are thin film resistors such as titanium tungsten TiW. The facet films 62 and 63 are AR films having a reflectivity of 1.0% or less, and substantially achieve absent reflex. The AR films are made of a dielectric film made of $MgF_2$ and TiON.

The electrodes 56 and 66, the power supply electrode 59 and the ground electrode 60 are made of conductive material such as Au (gold). A reverse face electrode 61 is formed on a lower face of the substrate 50. The reverse face electrode 61 extends through the TDA-DFB region A, the CSG-DBR region B and the SOA region C.

Each of the electrodes 56 and 66 and the heaters 58a and 58b is electrically connected to each of the wiring patterns 17 of the chip carrier 16 via each of the bonding wires 26, as illustrated in FIG. 1A.

As illustrated in FIG. 1B, FIG. 4A and FIG. 4B, the lead pins 24 are connected to the flexible substrate 70. Therefore, it is possible to input an electrical signal or output an electrical signal via the flexible substrate 70. Electrical power is supplied to the electrodes 56 and 66 and the heaters 58a and 58b of the wavelength tunable laser element 30, via the wirings 78, the lead pins 24, the wiring patterns 22 and 17, and the boding wires 25 and 26 of the flexible substrate 70. Thus, the wavelength tunable laser element 30 is activated. And a laser light is emitted.

As indicated with the dashed line of FIG. 1A, the emitted light passes through the lens 32 and is divided into two lights by the beam splitter 34. One of the divided lights is output toward outside from the window 18. The other of the divided lights is further divided into two lights by the beam splitter 36. Each of the divided two lights is input into each of the light receiving elements 37 and 38.

When the light receiving elements 37 and 38 receive a light having passed through the etalon 39, the light receiving elements 37 and 38 output a current. A current that is output from the light receiving elements 37 and 38 via the wiring patterns 15, the bonding wires 25, the wiring patterns 22, and the lead pins 24 is detected. It is possible to control the wavelength of the wavelength tunable laser element 30, on the basis of the current.

When electrical power is supplied to the temperature adjusting element 12 via the wirings 78, the lead pins 24, the wiring patterns 22 and the electrodes 13 of the flexible substrate 70, the temperature in the chassis 10 is adjusted and the wavelength is controlled.

It is possible to detect the temperature with use of the thermistor 40. The thermistor 40 detects the temperature of the surface of the chassis 10 and outputs a current according to the temperature. When the current output by the thermistor 40 is detected via the electrodes 42, the pads 74 and the wirings 76, the temperature of the surface of the chassis 10 is detected. It is possible to approximately calculate the temperature inside of the chassis 10, from the temperature of the surface of the chassis 10.

In the first embodiment, the thermistor 40 is provided on the external wall 10a of the chassis 10, and is electrically connected to the flexible substrate 70. Thus, it is possible to detect the temperature with use of an external component. And it is possible to control the temperature with use of the external component. As illustrated in FIG. 4A, the thermistor 40 is connected to the flexible substrate 70 with use of the electrodes 42 and the pads 74. The lead pins 24 are not used. That is, the lead pins 24 are not connected to the thermistor 40. It is therefore possible to reduce the number of the lead pins 24.

As described later, it is difficult to provide the temperature adjusting element 12, the light receiving elements 37 and 38, out of the chassis 10. On the other hand, even if the thermistor 40 is provided out of the chassis 10, the temperature can be detected. That is, it is possible to approximately calculate the temperature inside of the chassis 10, on the basis of the temperature of the external wall 10a detected by the thermistor 40. It is therefore possible to detect the temperature. And it is possible to suppress the increasing of the number of the lead pins 24.

The feedthrough 20 projects from the external wall 10a of the chassis 10 to outside of the chassis 10. The lead pins 24 are provided on the surface of the feedthrough 20 out of the chassis 10. The thermistor 40 is provided out of the chassis 10, and may be provided on a wall face other than the external wall 10a. However, when the flexible substrate 70 is long, the structure may be complicated. It is therefore preferable that the thermistor 40 may be provided on the external wall 10a as well as the feedthrough 20. When the flexible substrate 70 faces with the external wall 10a, the flexible substrate 70 is electrically connected to the lead pins 24 and the thermistor 40. Therefore, the structure may be simple.

The pads 74 and the wirings 76 are provided on the face 70a of the flexible substrate 70. When the face 70a faces with the external wall 10a and the flexible substrate 70 is connected to the lead pins 24, the electrodes 42 of the thermistor 40 are connected to the pads 74 and the wirings 76. The wirings 78 of the face 70b are connected to the lead pins 24 via the via electrodes 72. Thus, the optical semiconductor device 100 can be electrically connected to the external component via the flexible substrate 70.

As illustrated in FIG. 5, the wavelength tunable laser element 30 includes the electrodes 56 and 66, and the heaters 58a and 58b. The plurality of lead pins 24 includes lead pins which are connected to the electrodes and the heaters. Therefore, the number of the lead pins 24 is large. However, the number of the lead pins 24 is large, downsizing of the optical semiconductor device 100 may be difficult. In the first embodiment, the thermistor 40 is provided out of the chassis 10. Therefore, the lead pins 24 are not connected to the thermistor 40. It is therefore possible to suppress increasing of the number of the lead pins 24. And downsizing of the optical semiconductor device 100 may be possible. The wavelength tunable laser element 30 may include a SG-DFG region as a gain region, instead of the TDA-DFB region. The wavelength tunable laser element 30 may include the SG-DBR region as a reflection region, instead of the CSG-DBR region.

When the temperature adjusting element 12 is provided out of the chassis 10, the temperature control of the wavelength tunable laser element 30 may be difficult. It is therefore preferable that the temperature adjusting element 12 is mounted inside of the chassis 10. In this case, a part of the lead pins 24 are connected to the electrodes 13 of the temperature adjusting element 12. In the first embodiment, the temperature adjusting element 12 is housed inside of the chassis 10. And the thermistor 40 is provided out of the chassis 10. Therefore, the temperature control is possible by using the temperature adjusting element 12. And, increasing of the number of the lead pins 24 is suppressed.

When the light receiving elements 37 and 38 receive light, the light receiving elements 37 and 38 output currents. It is possible to control the wavelength of the wavelength tunable laser element 30 on the basis of the currents. Therefore, it is preferable that the light receiving elements 37 and 38 are housed inside of the chassis 10 together with the wavelength tunable laser element 30. In this case, a part of the lead pins 24 are connected to the electrodes 13 of the temperature adjusting element 12. In the first embodiment, the light receiving elements 37 and 38 are housed inside of the chassis 10, and the thermistor 40 is provided out of the chassis 10. It is therefore possible to control the wavelength by using the light receiving elements 37 and 38. Increasing of the number of the lead pins 24 is suppressed.

Second Embodiment

Figure 6A:
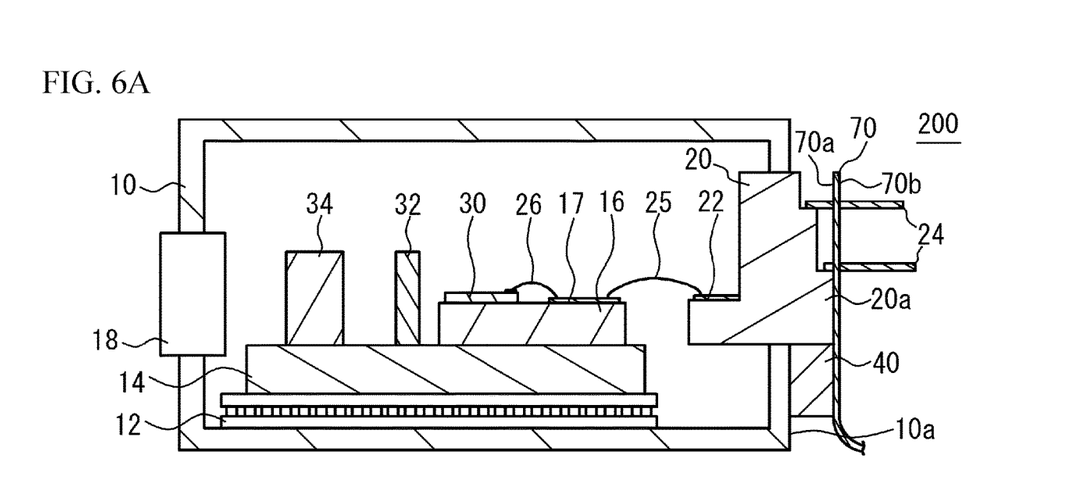
FIG. 6A illustrates a cross sectional view of an optical semiconductor device in accordance with a second embodiment.
Figure 6B:
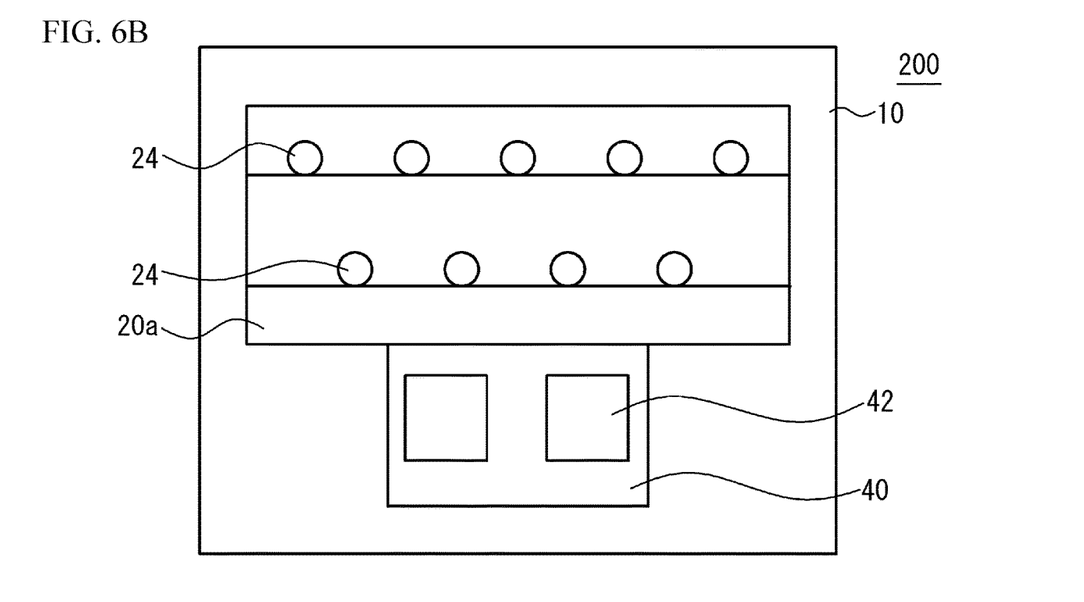
FIG. 6B illustrates a front view of an optical semiconductor device.

The locations of the lead pins 24 of the second embodiment are different from those of the first embodiment. FIG. 6A illustrates the cross section of an optical semiconductor device 200 of the second embodiment. FIG. 6B illustrates a front view of the optical semiconductor device 200, and enlarges vicinity of the feedthrough 20 and the thermistor 40. As illustrated in FIG. 6A and FIG. 6B, steps are formed in a portion of the feedthrough 20 out of the chassis 10. Each of the lead pins 24 is provided on each of the steps.

Figure 7A:
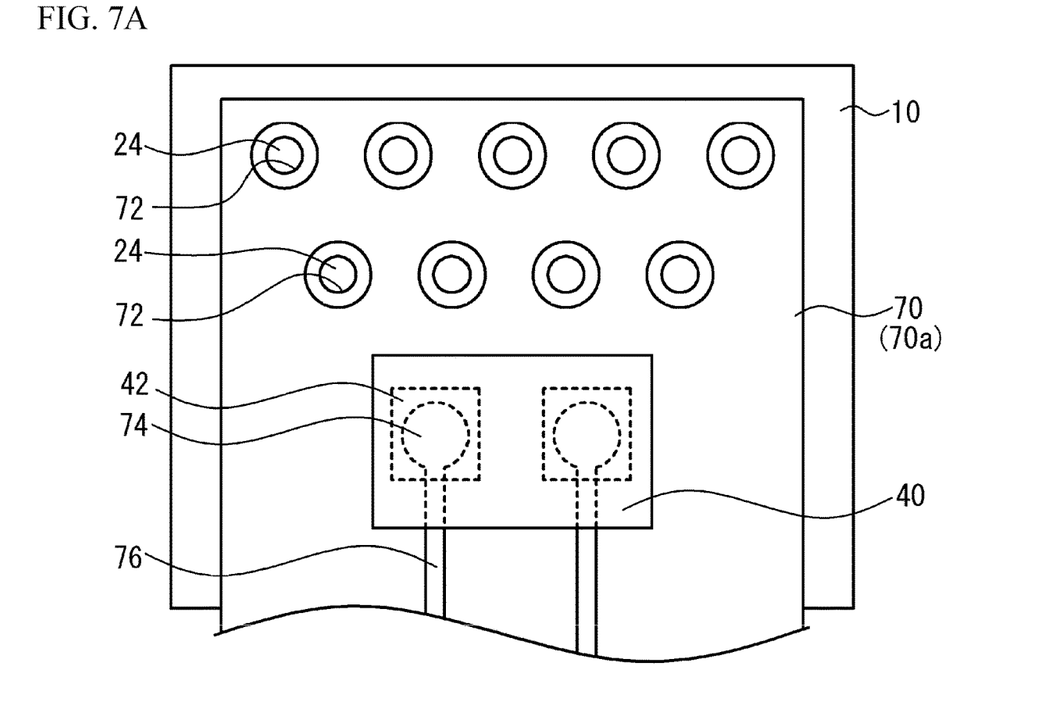
FIG. 7A illustrates front views of a case where a flexible substrate is connected to lead pins.
Figure 7B:
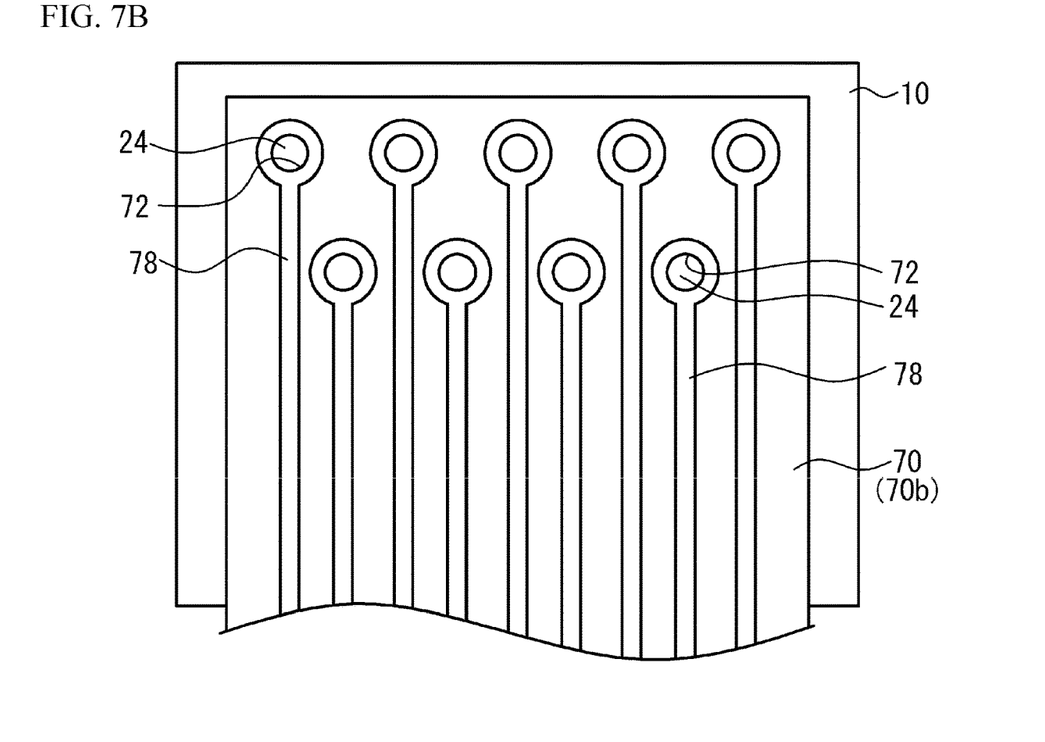
FIG. 7B illustrates front views of a case where a flexible substrate is connected to lead pins.

FIG. 7A and FIG. 7B illustrate front views of a case where the flexible substrate 70 is connected to the lead pins 24. FIG. 7A illustrates the side of the face 70a. FIG. 7B illustrates the side of the face 70b. As illustrated in FIG. 7A and FIG. 7B, two columns of the via electrodes 72 are provided according to the lead pins 24. As illustrated in FIG. 7A, the thermistor 40 is under the via electrodes 72. The electrodes 42 are connected to the pads 74. As illustrated in FIG. 7B, the wirings 78 connected to the via electrodes 72 are provided on the face 70b. Other structures are the same as those of the first embodiment.

In the second embodiment, the lead pins 24 are not connected to the thermistor 40, as well as the first embodiment. Therefore, increasing of the number of the lead pins 24 can be suppressed. And it is possible to detect the temperature with use of the thermistor 40.

Third Embodiment

Figure 8:
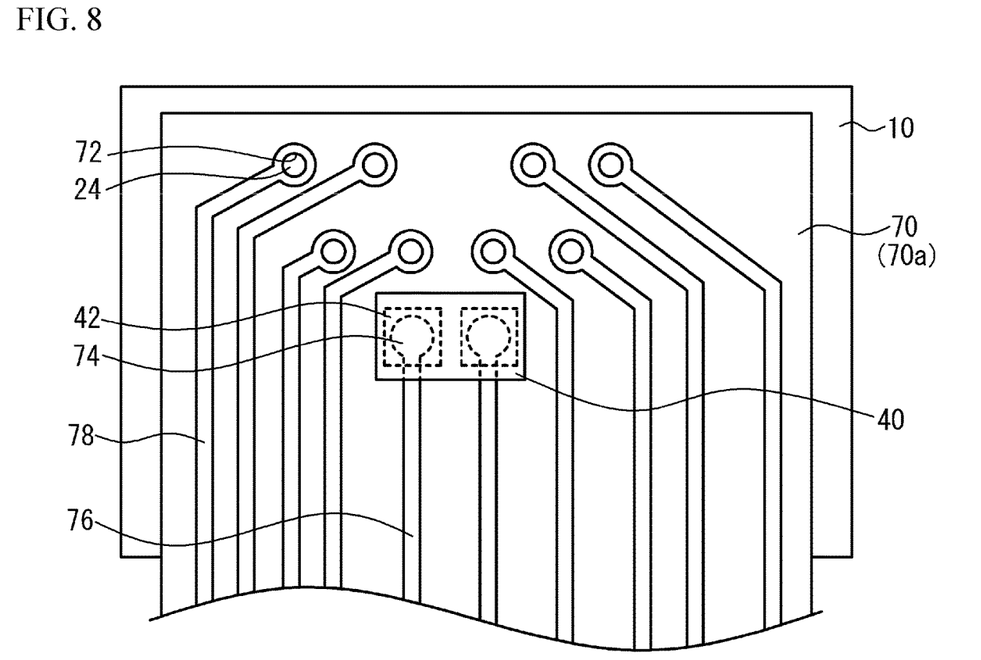
FIG. 8 illustrates a front view of a case where a flexible substrate is connected to lead pins.

FIG. 8 illustrates a front view of a case where the flexible substrate 70 is connected to the lead pins 24, and illustrates the side of the face 70a. As illustrated in FIG. 8, the wirings 76 and 78 are provided on the face 70a. The wirings 78 are bent. Thereby, the wirings 78 does not overlap with the thermistor 40. The wirings 78 are not connected to the pads 74 and the wirings 78. When the face 70a of the flexible substrate 70 faces with the chassis 10, the electrodes 42 are connected to the pads 74. And, the lead pins 24 are connected to the wirings 78. Other structures are the same as those of the first embodiment or the second embodiment.

In the third embodiment, the lead pins 24 are not connected to the thermistor 40, as well as the first embodiment. Therefore, the increasing of the number of the lead pins 24 can be suppressed. And it is possible to detect the temperature with use of the thermistor 40.

As in the case of the first embodiment to the third embodiment, the locations of the via electrodes 72 are determined according to the locations of the lead pins 24. Moreover, the layout of the wirings 76 and 78 is adjusted. Thus, it is possible to control the optical semiconductor device, with use of the flexible substrate 70. The terminals for the external component may not be necessarily the lead pins. A sensor other than the thermistor 40 may be used as the temperature detector.

Although the embodiments of the present invention have been described in detail, it is to be understood that the various change, substitutions, and alterations could be made hereto without departing from the spirit and scope of the invention.

DESCRIPTION OF LETTERS OR NUMERALS

10 Chassis
10a External wall
12 Temperature adjusting element
13, 42, 56, 66 Electrode
14 Carrier
15, 17, 22 Wiring pattern
16 Chip carrier
18 Window
20 Feedthrough
24 Lead pin
25, 26 bonding wire
30 Wavelength tunable laser element
32 Lens
34, 36 Beam splitter
37, 38 Light receiving element
39 Etalon
40, 41 Thermistor
50 Substrate
51 Lower cladding layer
52 Active layer
53 Optical waveguide layer
54 Upper cladding layer
55 Contact layer
57 Insulating film
58a, 58b Heater
59 Power supply electrode
60 Ground electrode
61 Reverse electrode
62, 63 Facet film
64 Optical amplification layer
67 Diffraction gratins
70 Flexible substrate
70a, 70b Face
72 Via electrode
74 Pad
76, 78 Wiring
100, 200 Optical semiconductor device

The invention claimed is:

1. An optical semiconductor device comprising:
a chassis that is a parallelepiped shape and has an external wall;
a feedthrough that penetrates the external wall of the chassis and has a projection portion projecting toward outside of the chassis from the external wall;
a connection terminal that is electrically connected to a component mounted in the chassis and is provided on the projection portion of the feedthrough;
a plurality of lead pins that are provided on the connection terminal on the projection portion;
a first temperature detector that is provided on an external face of the external wall of the chassis and detects a temperature of the chassis; and
a flexible substrate of which a first portion is electrically connected to the connection terminal via the lead pins and of which a second portion spaced from the first portion is connected to the first temperature detector, wherein the plurality of the lead pins are projecting to outside of the projection portion of the feedthrough and projecting from the first portion of the flexible substrate, and wherein the first temperature detector is provided between the external wall and the flexible substrate.

2. The optical semiconductor device as claimed in claim 1, wherein the first temperature detector is bonded to the external wall via a heat dissipation resin.

3. The optical semiconductor device as claimed in claim 1, wherein a thickness of the first temperature detector is equal to a projection amount of the projection portion.

4. The optical semiconductor device as claimed in claim 1, further comprising;

a wavelength tunable laser element that is housed in the chassis; and a second temperature detector that detects a temperature of the wavelength tunable laser element, wherein the connection terminal inputs an electrical signal into the wavelength tunable laser element via a first wiring that is provided on the wavelength tunable laser element, the second temperature detector and the flexible substrate.

5. The optical semiconductor device as claimed in claim 4, wherein a second wiring that is provided on the flexible substrate and has a pad connected to an electrode of the first temperature detector is provided on a face that is different from a face on which the first wiring is provided.

\* \* \* \* \*